US011140780B2

(12) United States Patent
Ganor et al.

(10) Patent No.: US 11,140,780 B2
(45) Date of Patent: Oct. 5, 2021

(54) NETWORKING CARDS WITH INCREASED PERFORMANCE

(71) Applicant: Mellanox Technologies, Ltd., Yokneam (IL)

(72) Inventors: Avraham Ganor, Shoam (IL); Ariel Naftali Cohen, Zichron Yaakov (IL); Assad Khamaisee, Kfar Kana (IL); Andrey Blyahman, Haifa (IL); Doron Fael, Zichron Yaakov (IL); Sergey Savich, Shlomi (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 16/894,956

(22) Filed: Jun. 8, 2020

(65) Prior Publication Data

US 2020/0389976 A1 Dec. 10, 2020

Related U.S. Application Data

(63) Continuation-in-part of application No. 16/436,157, filed on Jun. 10, 2019, now Pat. No. 10,736,218.

(51) Int. Cl.
*H05K 1/14* (2006.01)
*H05K 7/14* (2006.01)

(52) U.S. Cl.
CPC ........... *H05K 1/141* (2013.01); *H05K 7/1487* (2013.01); *H05K 7/1491* (2013.01); *H05K 7/1492* (2013.01)

(58) Field of Classification Search
CPC combination set(s) only.
See application file for complete search history.

(56) References Cited

U.S. PATENT DOCUMENTS 5,371,653 A * 12/1994 Kametani ............. H01L 23/467
174/252
5,611,057 A 3/1997 Pecone et al.
(Continued)

FOREIGN PATENT DOCUMENTS

EP 0229503 7/1987
EP 3016487 5/2016

OTHER PUBLICATIONS

U.S. Appl. No. 16/436,157, filed Jun. 10, 2019, U.S. Pat. No. 10,736,218, Issued.

*Primary Examiner* — Lisa Lea-Edmonds
(74) *Attorney, Agent, or Firm* — Alston & Bird LLP

(57) ABSTRACT

Apparatuses, systems, and associated methods of manufacturing are described that provide a networking card arrangement with increased thermal performance. An example arrangement includes a primary network card that defines a first card-to-board connection and a networking chipset supported by the primary network card. The arrangement also includes an auxiliary network card that defines a second card-to-board connection and networking cable connectors supported by the auxiliary network card that receive networking cables therein. The arrangement further includes a card connection element that operably connects the primary network card and the auxiliary network card. In an operational configuration in which the primary network card and the auxiliary network card are received by a server board via the first card-to-board connection and the second card-to-board connection, the primary network card is spaced from the auxiliary network card such that air may pass therebetween.

20 Claims, 12 Drawing Sheets

(56) References Cited

U.S. PATENT DOCUMENTS

| | | | | |
|---|---|---|---|---|
| 5,908,333 | A * | 6/1999 | Perino | H01R 12/712 |
| | | | | 439/631 |
| 6,325,636 | B1 * | 12/2001 | Hipp | G06F 1/183 |
| | | | | 361/788 |
| 6,328,598 | B1 * | 12/2001 | Harris, Jr. | H05K 1/141 |
| | | | | 439/218 |
| 6,349,029 | B1 * | 2/2002 | Leman | G06F 1/18 |
| | | | | 16/221 |
| 6,411,506 | B1 * | 6/2002 | Hipp | G06F 1/183 |
| | | | | 174/261 |
| 6,449,150 | B1 * | 9/2002 | Boone | H05K 7/20563 |
| | | | | 165/104.33 |
| 6,504,722 | B2 * | 1/2003 | Vittet | H05K 7/1461 |
| | | | | 165/104.33 |
| 6,721,182 | B1 | 4/2004 | Wells et al. | |
| 7,019,983 | B2 * | 3/2006 | Record | G06F 1/189 |
| | | | | 361/760 |
| 7,764,511 | B2 * | 7/2010 | Lee | G06F 13/409 |
| | | | | 361/796 |
| 7,821,792 | B2 * | 10/2010 | Belady | H05K 7/20718 |
| | | | | 361/735 |
| 8,630,087 | B1 * | 1/2014 | Reynov | G06F 1/181 |
| | | | | 361/679.5 |
| 9,870,035 | B2 * | 1/2018 | Birke | H05K 7/1487 |
| 10,010,007 | B2 * | 6/2018 | Itkin | G06F 1/185 |
| 2004/0008484 | A1 * | 1/2004 | Konshak | G06F 1/20 |
| | | | | 361/679.5 |
| 2006/0067066 | A1 * | 3/2006 | Meier | H05K 1/14 |
| | | | | 361/785 |
| 2007/0297137 | A1 * | 12/2007 | Glahn | H05K 7/1404 |
| | | | | 361/699 |
| 2014/0240930 | A1 * | 8/2014 | Arvelo | H05K 7/2039 |
| | | | | 361/721 |
| 2017/0172007 | A1 * | 6/2017 | Itkin | H05K 1/117 |

\* cited by examiner

NETWORKING CARDS WITH INCREASED PERFORMANCE

CROSS REFERENCE TO RELATED APPLICATIONS

This application is a continuation-in-part application of U.S. application Ser. No. 16/436,157, filed Jun. 10, 2019, and entitled "NETWORKING CARDS WITH INCREASED THERMAL PERFORMANCE," which application is incorporated by reference herein in its entirety.

TECHNOLOGICAL FIELD

Example embodiments of the present invention relate generally to network connection systems and, more particularly, to systems and apparatuses for improving performance of network cards.

BACKGROUND

Datacenters and other networking systems may include connections between switch systems, servers, racks, and devices in order to provide for signal transmission between one or more of these elements. Such connections may be made using cables, transceivers, networking boxes, printed circuit boards (PCBs), cage receptacles, and connector assemblies, each of which may generate heat during operation. Over time, these systems may experience signal degradation, system component failure, or the like as a result of the heat generated by these components.

BRIEF SUMMARY

Apparatuses and associated methods of manufacturing are provided for networking card arrangements with increased thermal performance. An example networking card arrangement may include a primary network card that defines a first card-to-board connection, and a networking chipset supported by the primary network card. The arrangement may further include an auxiliary network card that defines a second card-to-board connection and one or more networking cable connectors supported by the auxiliary network card. Each networking cable connector may be configured to receive a networking cable therein. The arrangement may further include a card connection element that operably connects the primary network card and the auxiliary network card such that electrical signals may be transmitted therebetween. In an operational configuration in which the primary network card and the auxiliary network card are received by a server board via the first card-to-board connection and the second card-to-board connection, the primary network card is spaced from the auxiliary network card such that air may pass therebetween.

In some embodiments, the primary network card may further define a first surface supporting the networking chipset and a second surface opposite the first surface. In such an embodiment, the auxiliary network card may further define a first surface supporting the one or more networking cable connectors and a second surface opposite the first surface. In the operational configuration, the primary network card and the auxiliary network card may be positioned such that the first surface of the primary network card is proximate the second surface of the auxiliary network card.

In some embodiments, in the operational configuration, the primary network card and the auxiliary network card may be positioned substantially perpendicular with respect to the server board. In some cases, the card connection element comprises a flexible printed circuit board (PCB) or wire harness.

In some further embodiments, the networking card arrangement may further include a secondary network card that defines a third card-to-board connection, one or more secondary networking cable connectors that receive a networking cable therein, and a secondary card connection element that operably connects the primary network card and the secondary network card such that electrical signals may be transmitted therebetween. In the operational configuration, the secondary network card may be configured to be received by the server board via the third card-to-board connection such that the secondary network card is spaced from the primary network card such that air may pass therebetween. The secondary network card may further define a first surface supporting the one or more networking cable connectors and a second surface opposite the first surface. In the operational configuration, the primary network card and the secondary network card may be positioned such that the first surface of the secondary network card is proximate the second surface of the primary network card.

Apparatuses and associated methods of manufacturing are also provided for networking card arrangements with dynamical power management and redistribution. An example networking card arrangement may include a primary network card that defines a first card-to-board connection, and a networking chipset supported by the primary network card. The arrangement may further include an auxiliary network card that defines a second card-to-board connection and power management circuitry supported by the auxiliary network card. The arrangement may further include a card connection element that operably connects the primary network card and the auxiliary network card such that electrical signals may be transmitted therebetween. In an operational configuration in which the primary network card and the auxiliary network card are received by a server board via the first card-to-board connection and the second card-to-board connection, the primary network card is spaced from the auxiliary network card such that air may pass therebetween. Additionally, in the operational configuration, the power management circuitry may direct power from the auxiliary network card to the networking chipset of the primary network card via the card connection element.

In some embodiments, the primary network card may further define a first surface supporting the networking chipset and a second surface opposite the first surface. In such an embodiment, the auxiliary network card may also define a first surface supporting the power management circuitry and a second surface opposite the first surface. In the operational configuration, the primary network card and the auxiliary network card may be positioned such that the first surface of the primary network card is proximate the second surface of the auxiliary network card.

In some embodiments, the power management circuitry may include a power source configured to generate power for directing to the networking chipset of the primary network card.

In other embodiments, the power management circuitry may be configured to, in the operational configuration, direct power supplied to the auxiliary network card by the second card-to-board connection to the networking chipset of the primary network card.

In some embodiments, the networking card arrangement may also include one or more networking cable connectors supported on the auxiliary network card and each networking cable connector may be configured to receive a networking cable therein. In such an embodiment, the power management circuitry may be further configured to direct power supplied to the auxiliary network card from one or more networking cables received by the one or more networking cable connectors to the networking chipset of the primary network card.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Overview

Figure 1A:
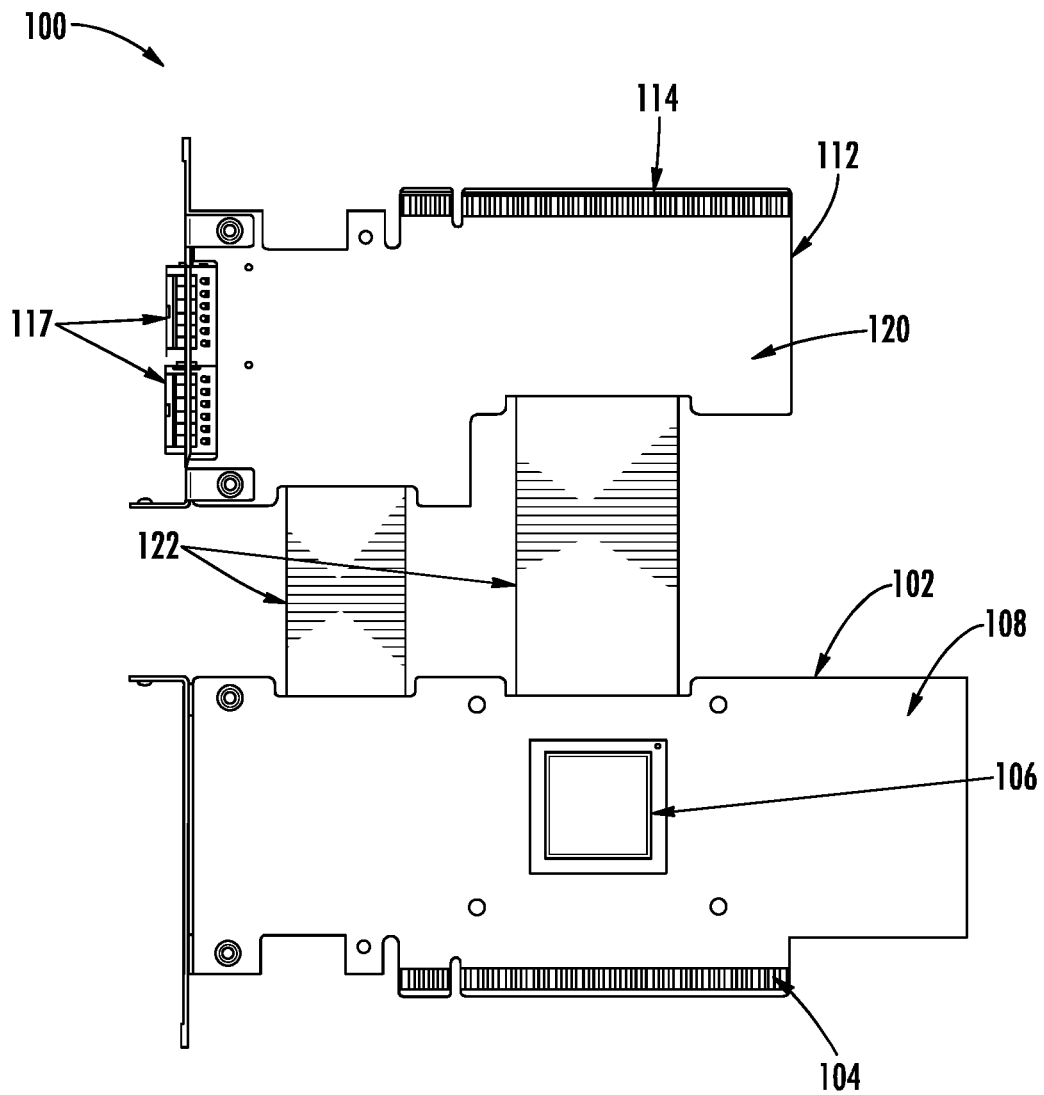
FIGS. 1A-1B are front and back views, respectively, of a networking card arrangement according to an example embodiment.

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As discussed herein, the example embodiment is described with reference to networking cable connectors (e.g., cable receptacle or the like) that is configured to receive a Quad Small Form-factor Pluggable (QSFP) connector as the networking cable. The embodiments of the present disclosure, however, may be equally applicable for use with any connector (e.g., Small Form Pluggable (SFP), C-Form-factor Pluggable (CFP), and the like). Moreover, the embodiments of the present invention may also be used with any cable (e.g., passive copper cable (PCC), active copper cable (ACC), or the like) or interconnect utilized by datacenter racks and associated switch modules (e.g., an active optical module (AOM), QSFP transceiver module, or the like).

As noted above and described hereafter, networking systems, such as those found in datacenters, may establish inter-rack connections between racks and intra-rack connections between networking boxes, PCBs, and the like located within the same rack. These connections often rely upon transceivers, processors, chipsets, PCBs, and other networking components that generate heat during operation. This heat generation may damage networking components over time by conducting heat between adjacent components and/or increasing the ambient temperature for all networking components in the system. Furthermore, traditional attempts to cool these components rely upon air circulation (e.g., convective cooling) in which upstream components often preheat the air such that downstream components fail to receive sufficiently cool air for effective convective cooling. Furthermore, the costs associated with cooling these traditional systems increase (e.g., require increased fan speed) as the power of networking devices (and associated heat output) increase. In order to address these issues and others, the devices of the present disclosure provide a primary network card for supporting networking components and an auxiliary network card for supporting networking components. The networking card arrangement described hereafter positions these network cards such that air may pass between the primary network card and the auxiliary network card to provide increased thermal performance for the networking components supported thereon.

As described hereafter, network cards and associated communication systems are often constrained by regulations (e.g., industry standards or the like) that define acceptable spacing between components, regulate the overall size of these components, specify the types of connections between components, limit the power supplied to a relevant connection, and the like. By way of example, network cards may be, in operation, connected via card-to-board connectors to a server board, and the server board may in some instances supply power to one or more components supported by the network card. This power supplied to the network card may be limited, for example, to 75 W per card-to-board connection, or to any other standard specification limitation. As such, the operation of some components may be restricted, throttled, or the like by the power limitations associated with the card-to-board connection. In order to address these issues and others, the devices of the present disclosure provide power management circuitry on an auxiliary network card so as to dynamically redistribute or otherwise direct power between network cards.

Networking Card Arrangement

Figure 1B:
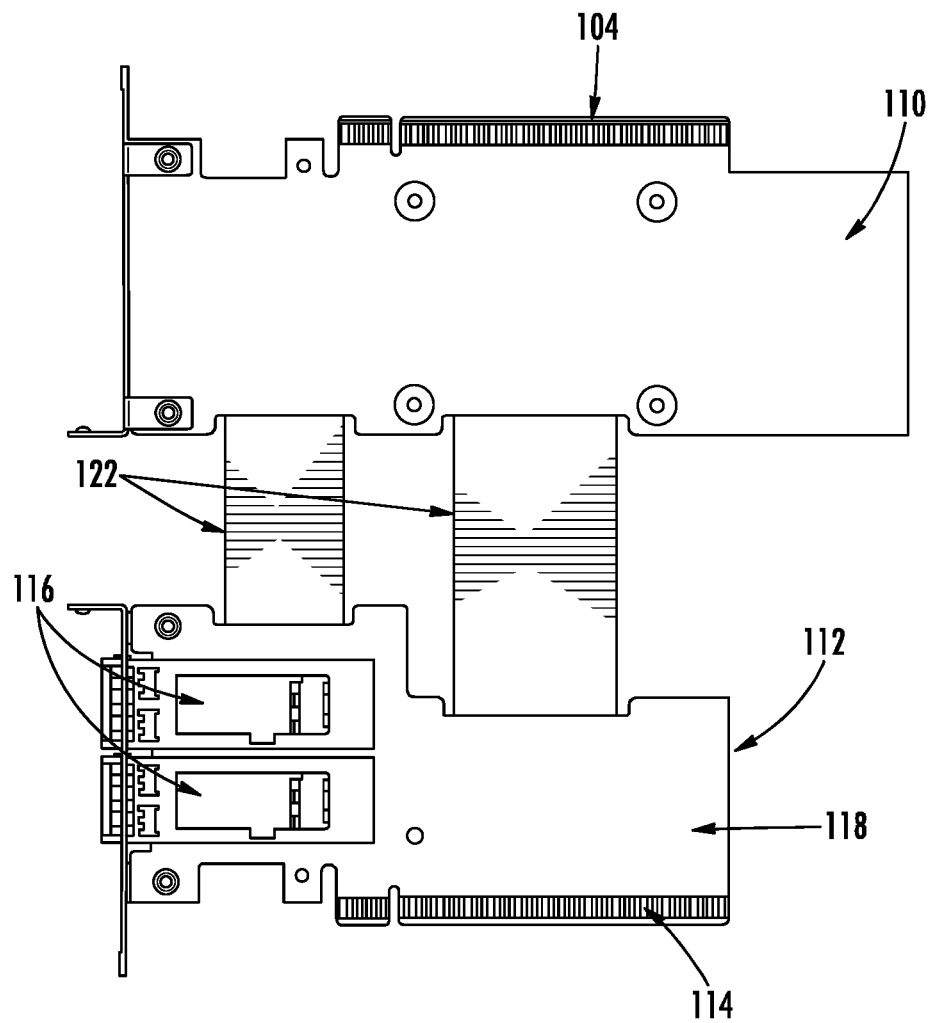

With reference to FIGS. 1A-1B, an example networking card arrangement 100 (e.g., arrangement 100) for network connections is illustrated. As shown, the arrangement 100 may include a primary network card 102, a networking chipset 106 supported by the primary network card 102, an auxiliary network card 112, and one or more networking cable connectors 116 supported by the auxiliary network card 112. The primary network card 102 may define a first card-to-board connection 104 configured to, in an operational configuration such as shown in FIGS. 2-6, communicably couple the primary network card 102 with a substrate (e.g., server board 200, PCB, or the like) via a corresponding element (e.g., card slots 202 or the like) of the substrate. Similarly, the auxiliary network card 112 may define a second card-to-board connection 114 configured to, in an operational configuration, communicably couple the auxiliary network card 112 with a substrate (e.g., server board 200, PCB, or the like) via a corresponding element (e.g., card slots 202 or the like) of the substrate. As would be evident to one of ordinary skill in the art in light of the present disclosure, the card-to board connections 104, 114 may enable electrical signals to pass between the primary network card 102 and a substrate and the auxiliary network card 112 and the substrate. Furthermore, the card-to-board connections 104, 144 may enable power to be supplied to the primary network card 102 and auxiliary network card 112, respectively. While illustrated herein with peripheral component interconnect express (PCIe) components, the present disclosure contemplates that the connections between the primary network card 102, the auxiliary network card 112, and a substrate may be accomplished via any interface for connecting networking components.

With continued reference to FIGS. 1A-1B, the primary network card 102 may define a first surface 108 configured to support the networking chipset 106. The primary network card 102 may further define a second surface 110 located opposite the first surface 108 (e.g., a print surface 110). As would be evident to one of ordinary skill in the art in light of the present disclosure, network cards are often constrained by regulations (e.g., industry standards or the like) that define acceptable spacing between components and regulate the overall size of these components. As such, the second surface 110 of the primary network card 102 may, due to applicable regulations, define a print surface or side in which no networking components are supported.

The first surface 108 of the primary network card 102 may be configured to support a networking chipset 106 thereon. The networking chipset 106 may be configured to control operation of one or more networking components of the arrangement 100. The networking chipset 106 may be embodied in any number of different ways and may, for example, include one or more processing devices configured to perform independently. Furthermore, the networking chipset 106 may be understood to include a single core processor, a multi-core processor, and/or the like. By way of example, the networking chipset 106 may be configured to execute instructions stored in a memory or otherwise accessible to one or more processors of the networking chipset 106. Alternatively or additionally, the networking chipset 106 may be configured to execute hard-coded functionality. As such, whether configured by hardware or by a combination of hardware with software, the networking chipset 106 may represent an entity (e.g., physically embodied in circuitry) capable of performing operations according to an embodiment of the present invention while configured accordingly. While the first surface 108 of the primary network card 102 is illustrated and described herein with reference to a single networking chipset 106, the present disclosure contemplates that the primary network card 102 may support and/or define other networking elements (e.g., electrical traces, memory, circuitry, and/or the like) based upon the intended application of the arrangement 100.

With continued reference to FIGS. 1A-1B, the networking card arrangement 100 (e.g., arrangement 100) may also include an auxiliary network card 112 that may define a first surface 118 configured to support one or more networking cable connectors 116. Similar to the primary network card 102, the auxiliary network card 112 may also define a second surface 120 located opposite the first surface 118 (e.g., a print surface 120). The second surface 120 of the auxiliary network card 112 may, due to applicable regulations, define a print surface or side in which no networking components are supported.

As shown, the arrangement 100 may include cable connectors 116 configured to, in an operational configuration, receive a networking cable (not shown) therein. The cable connectors 116 may define an opening 117 through which the networking cable may be inserted into the cable connectors 116, and during operation, the networking cable (not shown) may transmit electrical/optical signals to the arrangement 100 and/or may receive electrical/optical signals from the arrangement 100. Furthermore, the networking cable (not shown) received by the cable connectors 116 may also, in some embodiments, at least partially supply power to the auxiliary card 114 and, via the card connection element 122 described hereafter, may also at least partially supply power to the components of the primary network card 102. While illustrated in FIGS. 1A-1B with two networking cable connectors 116 each configured to receive a respective networking cable therein, the networking card arrangement 100 (e.g., the auxiliary network card 112) of the present disclosure may include any number of networking cable connectors 116 based upon the application of the arrangement 100.

The networking card arrangement 100 may further define a card connection element 122 (for example, shown in FIG. 2) configured to operably connect the primary network card 102 and the auxiliary network card 112 such that electrical signals may be transmitted therebetween. By way of example, the networking chipset 106 may transmit an electrical signal from the primary network card 102 via the card connection element 122 to the cable connectors 116 of the auxiliary network card 112, and vice versa. In some embodiments, the card connection element 122 comprises a flexible printed circuit board (PCB). In other embodiments, the card connection element 122 comprises a wire harness. While illustrated herein with a flexible PCB as the card connection element 122, the present disclosure contemplates that any connection feature for providing high speed electrical communication between the primary network card 102 and the auxiliary network card 112 may be used. As would be evident to one of ordinary skill in the art in light of the present disclosure, the electrical signals transmitted between the primary network card 102 and the auxiliary network card 112 via the card connection element 122 may refer to electrical power (e.g., supplied electrical current) configured to power operation of components of the networking card arrangement 100.

Figure 2:
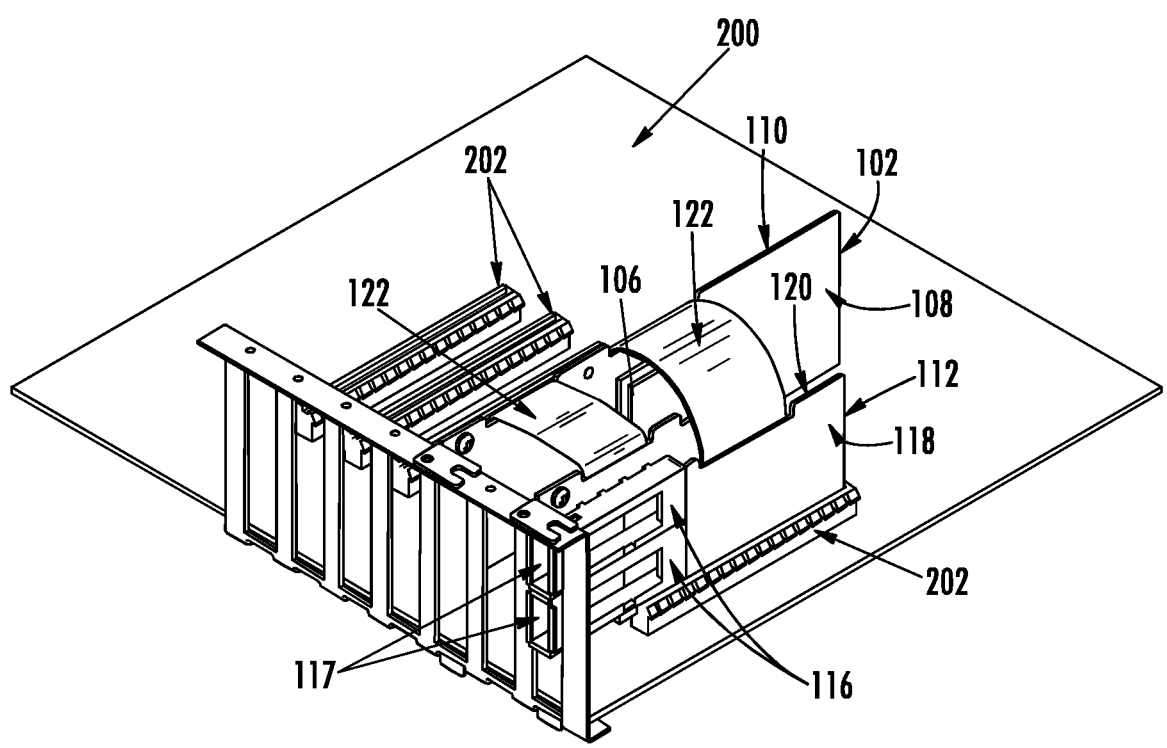
FIG. 2 is a front perspective view of the networking card arrangement of FIG. 1 in an operational configuration according to an example embodiment.
Figure 3:
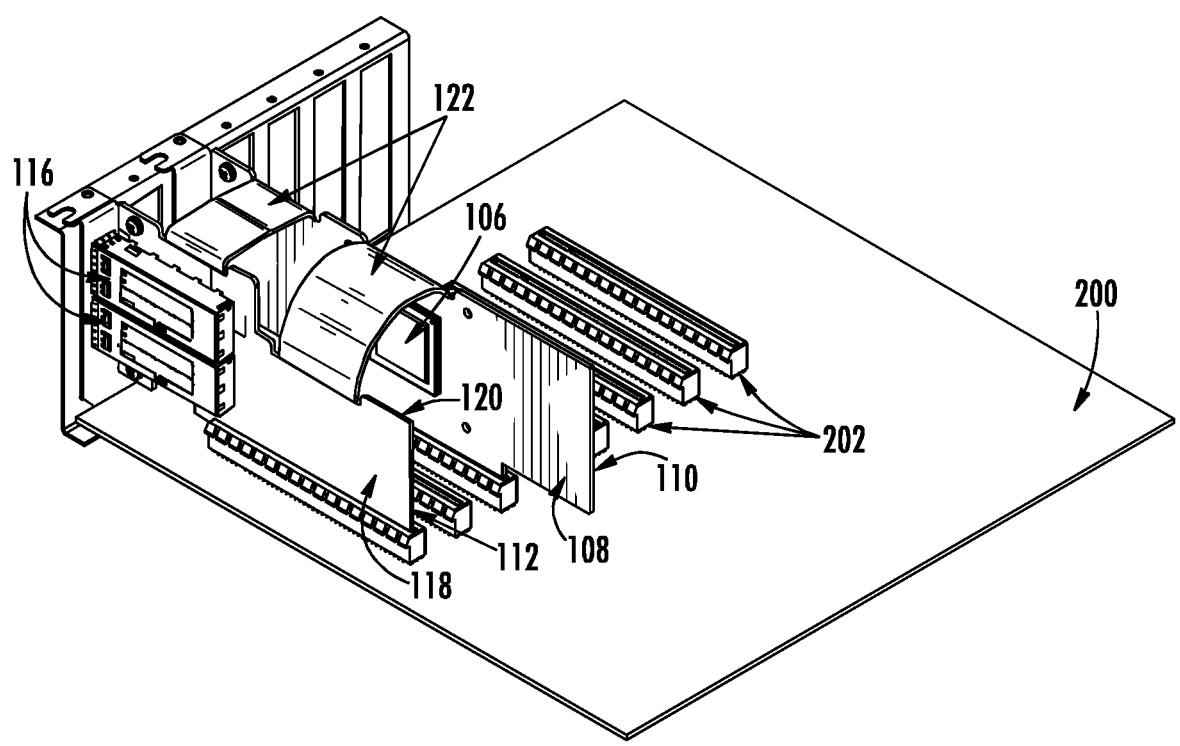
FIG. 3 is a back perspective view of the networking card arrangement of FIG. 1 in an operational configuration according to an example embodiment.
Figure 4:
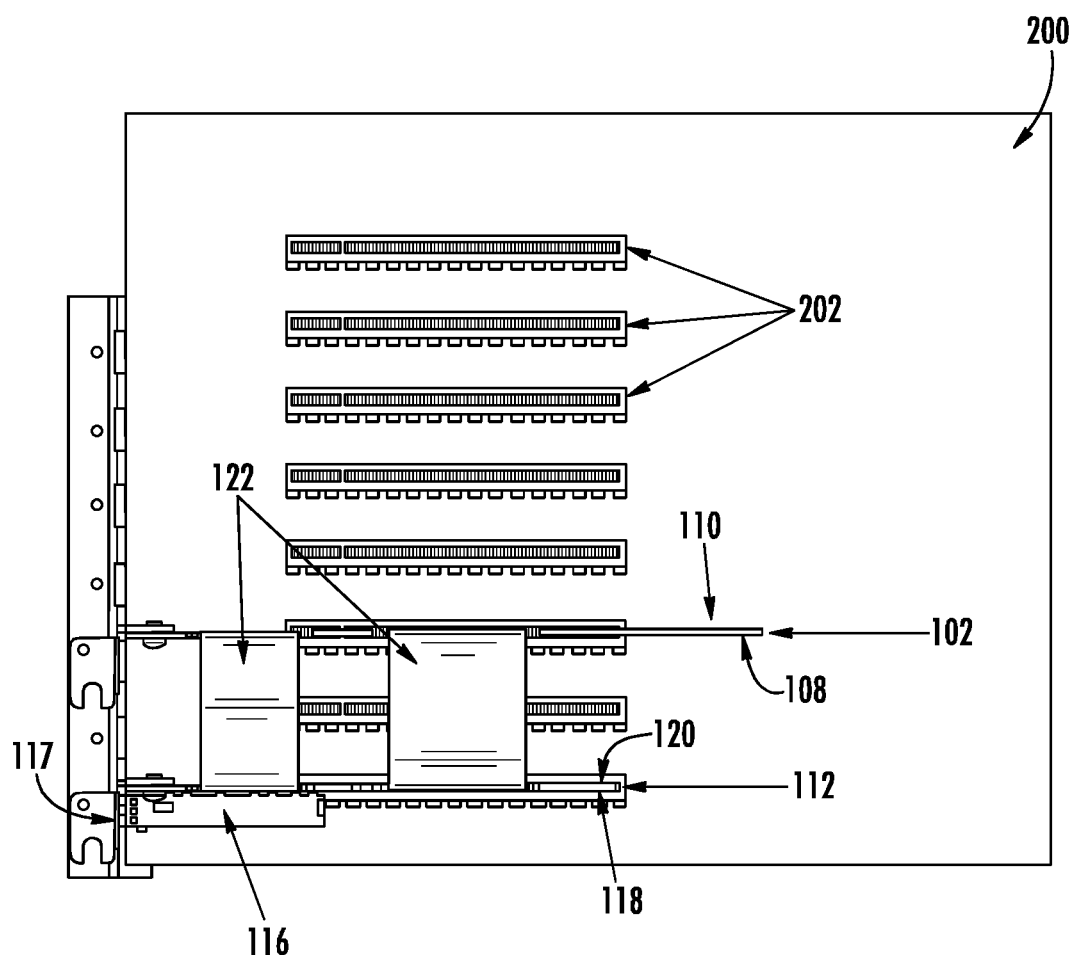
FIG. 4 is a top view of the networking card arrangement of FIG. 1 in an operational configuration according to an example embodiment.

With reference to FIGS. 2-4, the networking card arrangement 100 is illustrated in an operational configuration in which the primary network card 102 and the auxiliary network card 112 are received by a server board 200 via the first card-to-board connection 104 and the second card-to-board connection 114. As described above, the card-to board connections 104, 114 may enable electrical signals (e.g., and power/electrical current as described hereafter) to pass between the primary network card 102 and the server board 200 and the auxiliary network card 112 and the server board 200. In order to facilitate this connection, the server board 200 may define one or more slotted connections 202 (e.g., PCIe slots) configured to receive the card-to-board connections 104, 114 of the arrangement 100. As shown in FIGS. 2-4, the primary network card 102 and the auxiliary network card 112 may be positioned (via engagement between the slotted connections 202 and the card-to-board connections 104, 114) substantially perpendicular with respect to the server board 200. While illustrated and described herein with the network cards 102, 112 and the server board 200 positioned substantially perpendicular to each other, the present disclosure contemplates that the card-to-board connections 104, 114 may be dimensioned (e.g., sized and shaped) so as to position the network cards 102, 112 at any location or orientation on the server board 200 based upon the intended application of the arrangement 100.

With continued reference to the operational configuration of FIGS. 2-4, the primary network card 102 and the auxiliary network card 112 may be positioned such that the first surface 108 of the primary network card 102 is proximate the second surface 120 of the auxiliary network card 112. In this way, the primary network card 102 may support the networking chipset 106 such that no other networking components are proximate the networking chipset 106. Said differently, given that the second side 120 of the auxiliary network card 112 does not support networking components (e.g., a print side 120), the heat generated by the networking chipset 106 during operation may not affect performance of other networking components (e.g., networking cable connectors 116) of the arrangement 100. In this way, the auxiliary network card 112 may also support the networking cable connectors 116 (e.g., configured to receive networking cables (not shown) therein) such that no other networking components are proximate the networking cable connectors 116. As would be evident to one of ordinary skill in the art in light of the present disclosure, the networking cables (not shown) received by the one or more networking cable connectors 116 may generate heat during operation (e.g., QSFPs or other transceivers) that traditionally affected operation of other networking devices. Given that the first side 118 of the auxiliary network card 112 is opposite the networking chipset 106 in the operational configuration, the networking cables (not shown) received by the networking cable connectors 116 may not affect performance of other networking components (e.g., networking chipset 106) of the arrangement 100.

Furthermore, as shown in FIG. 4, the positioning of the arrangement 100 may be such that the primary network card 102 is spaced from the auxiliary network card 112 such that air may pass therebetween. In this way, air (generated by one or more fans or the like) may flow between the primary network card 102 and the auxiliary network card 112 to allow heat generated by the networking chipset 106 and the networking cable connectors 116 (and networking cables received therein) to dissipate via convective cooling. This configuration of the networking card arrangement 100 operates to increase the surface area (e.g., the area in contact with the air flow) in order to increase the heat dissipated from the primary network card 102 and the auxiliary network card 112 to an external environment of the arrangement 100. As described above, the positioning of the primary network card 102 and the auxiliary network card 112 may be such that air passing therebetween functions to prevent preheating of the air prior to contact with networking components supported by the network cards 102, 112.

In contrast, traditional network connections support networking elements on a single network card. As such, elements upstream (e.g., networking chipset 106) may exchange heat with the air passing thereby (e.g., via convection) such that the air is preheated prior to contact with downstream elements on the same network card, (e.g., networking cable connectors 116) thereby reducing the heat transfer between the downstream elements and the air. As described herein, the network card arrangement 100 of the present disclosure employs a separate primary network card 102 and auxiliary network card 112 to reduce or otherwise prevent air preheating.

Figure 5:
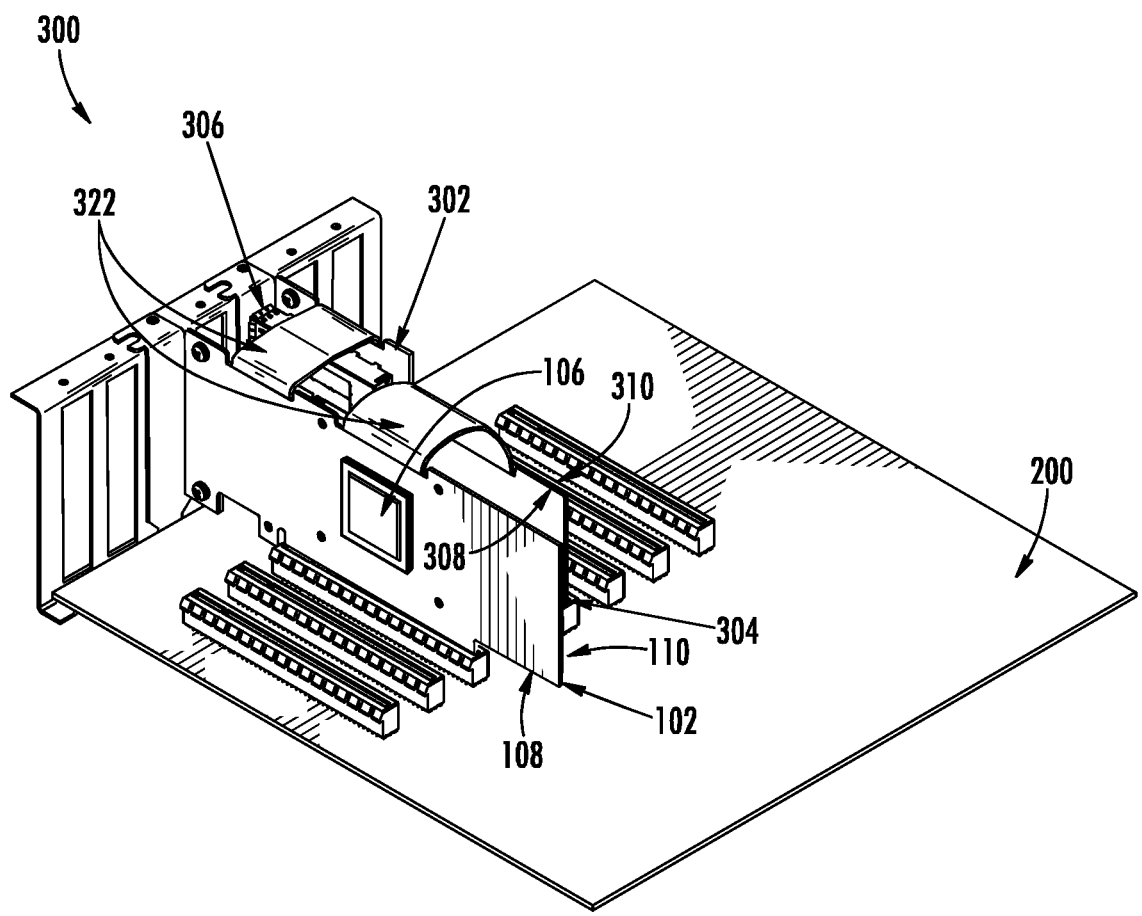
FIG. 5 is front perspective view of an alternative networking card arrangement in an operational configuration according to an example embodiment.
Figure 6:
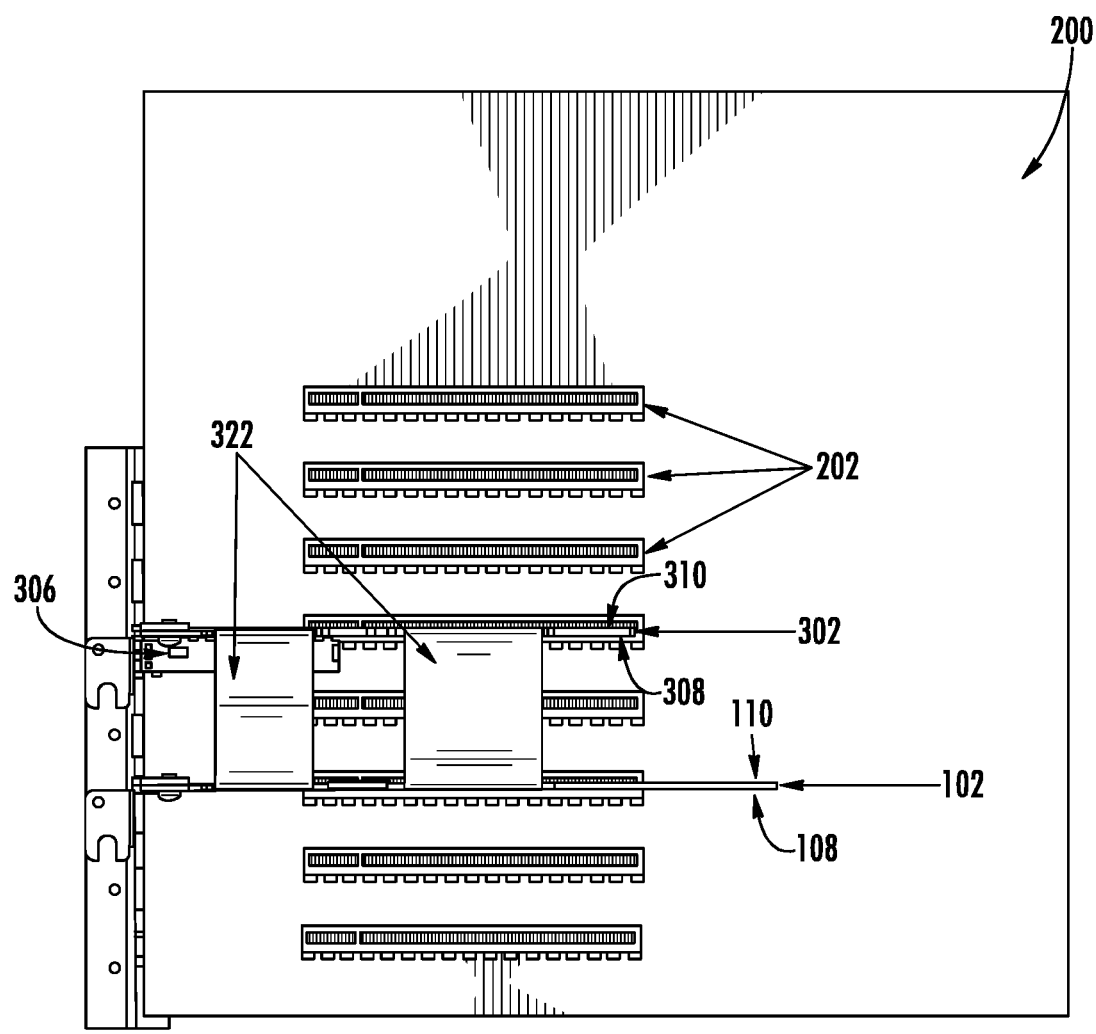
FIG. 6 is a top view of the alternative networking card arrangement of FIG. 5 in an operational configuration according to an example embodiment.

With reference to FIGS. 5-6, an alternative networking card arrangement 300 including a secondary network card 302 that defines a third card-to-board connection 304 is illustrated. As above, the third card-to-board connection 304 may enable electrical signals to pass between the secondary network card 302 and the server board 200. As shown, the networking card arrangement 300 may be similar to the arrangement 100 in FIGS. 2-4, but may include an additional secondary card 302 that supports one or more secondary networking cable connectors 306 thereon. Similar to networking cable connectors 116, the one or more secondary networking cable connectors 306 may be supported by a first surface 308 of the secondary network card 302 and may be configured to receive a networking cable therein. The secondary network card 302 may also include a second surface 310 opposite the first surface 308 that does not support networking components (e.g., print surface 310). The alternative networking card arrangement 300 may further include a secondary card connection element 322 configured to operably connect the primary network card 102 and the secondary network card 300 such that electrical signals may be transmitted therebetween. As would be evident to one of ordinary skill in the art in light of the present disclosure, the networking chipset 106 of the primary network card 102 may be configured to transmit and receive electrical signals to and from the secondary network card 302, via the secondary card connection 322.

As shown in the operational configuration of FIGS. 5-6, the secondary network card 302 may be configured to be received by the server board 200 via the third card-to-board connection 304 such that the secondary network card 302 is spaced from the primary network card 102 to allow air to pass therebetween. Furthermore, the primary network card 102 and the secondary network card 302 may be positioned such that the first surface 308 of the secondary network card 302 is proximate the second surface 110 of the primary network card 102. This configuration of the alternative networking card arrangement 300 may operate to further increase the surface area (e.g., the area in contact with air flow) in order to increase the heat dissipated from the primary network card 102, the auxiliary network card 112, and the secondary network card 302 to an external environment of the arrangement 300 while also increasing the number of potential networking cable connections. Similar to the arrangement 100 described above, the positioning of the primary network card 102 and the secondary network card 302 such that air may pass therebetween may prevent preheating of air prior to contact with other networking components supported by the network card 102, 302.

Example Method of Manufacture

Figure 7:
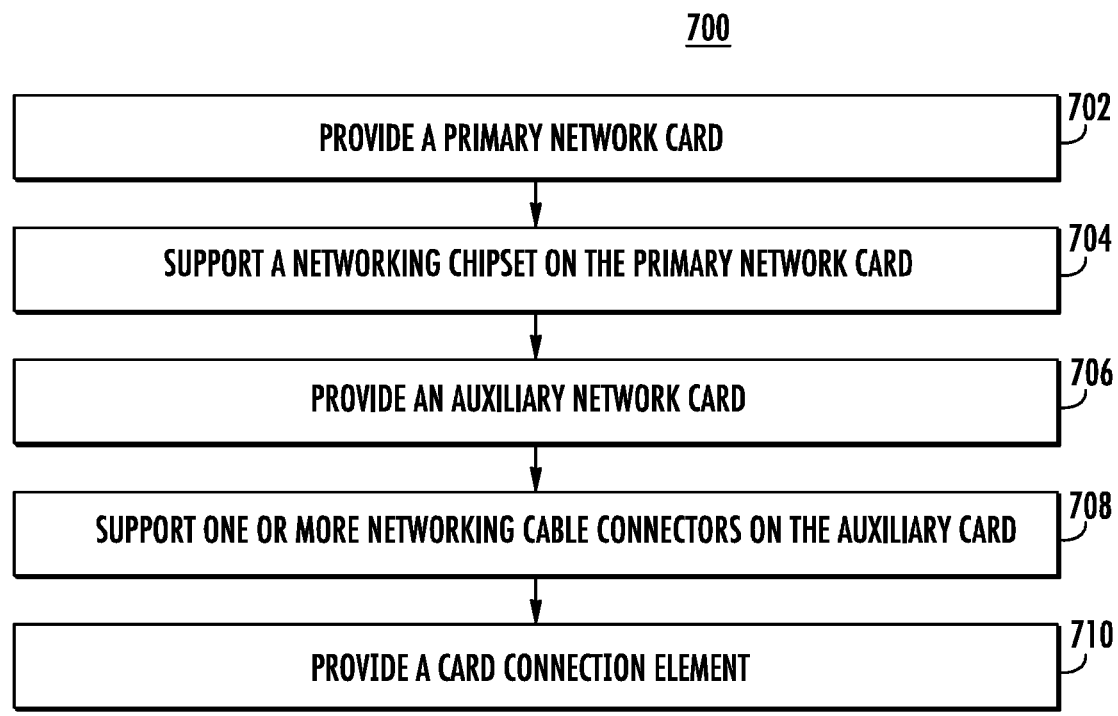
FIG. 7 is a flowchart illustrating a method of manufacturing a networking card arrangement according to an example embodiment.

With reference to FIG. 7, a method of manufacturing a networking card arrangement according to embodiments of the invention is illustrated. The method (e.g., method 700) may include the step of providing a primary network card at Block 702. As described above, the primary network card may define a first card-to-board connection configured to, in an operational configuration, communicably couple the primary network card with a server board via a corresponding element of the server board. The method 700 may also include supporting a networking chipset on the primary network card at Block 704. As described above, the networking chipset may be configured to control operation of one or more networking or communications components of the networking card arrangement and may be embodied in a number of different ways and may, for example, include one or more processing devices configured to perform independently.

The method 700 may also include providing an auxiliary network card at Block 706. The auxiliary network card may define a second card-to-board connection configured to, in an operational configuration, communicably couple the auxiliary network card with a server board via a corresponding element of the server board. The method 700 may also include supporting one or more networking cable connectors on the auxiliary network card at Block 708. The networking cable connectors may be configured to, in an operational configuration, receive a networking cable therein. The cable connectors may also define an opening through which the networking cable may be inserted into the cable connectors, and during operation, the networking cable (not shown) may transmit electrical/optical signals to the networking cable arrangement and/or may receive electrical/optical signals from the networking cable arrangement. In some embodiments, providing an auxiliary network card at Block 706 may further include providing power management circuitry supported by the auxiliary network card as described hereafter with reference to FIGS. 8A-10.

The method 700 may also include providing a card connection element at Block 710. The card connection element may be configured to operably connect the primary network card and the auxiliary network card such that electrical signals may be transmitted therebetween. By way of example, the networking chipset may transmit an electrical signal from the primary network card via the card connection element to the cable connectors of the auxiliary network card, and vice versa. In some embodiments, the card connection element comprises a flexible printed circuit board (PCB). In other embodiments, the card connection element comprises a wire harness. The manufacturing of the networking card arrangement may be such that the primary network card is spaced from the auxiliary network card to allow air to pass therebetween. In this way, air (generated by one or more fans or the like) may flow between the primary network card and the auxiliary network card to allow heat generated by the networking chipset and the networking cable connectors (and networking cables received therein) to dissipate via convective cooling.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

Power Management

Figure 8A:
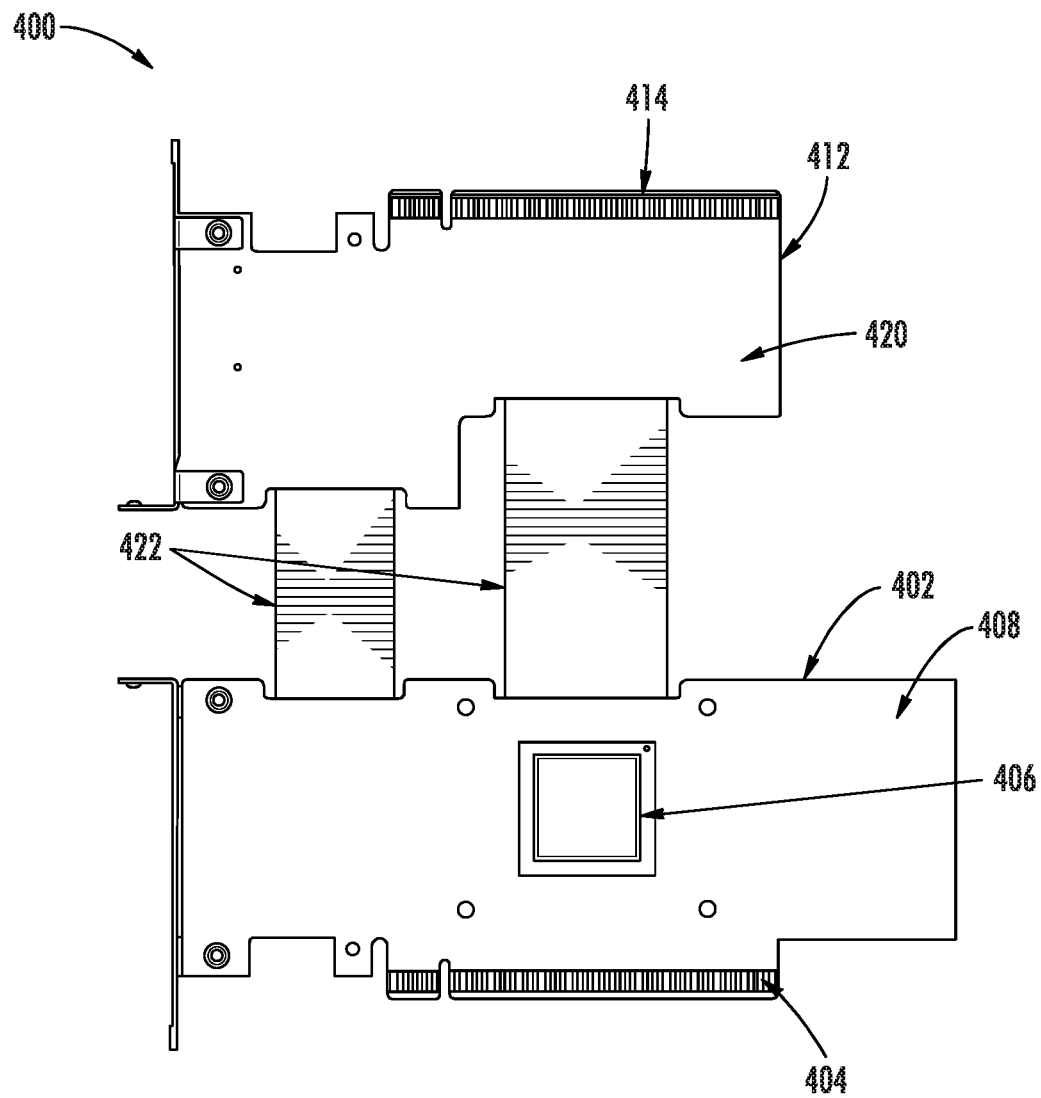
FIGS. 8A-8B are front and back views, respectively, of another networking card arrangement according to an example embodiment.
Figure 8B:
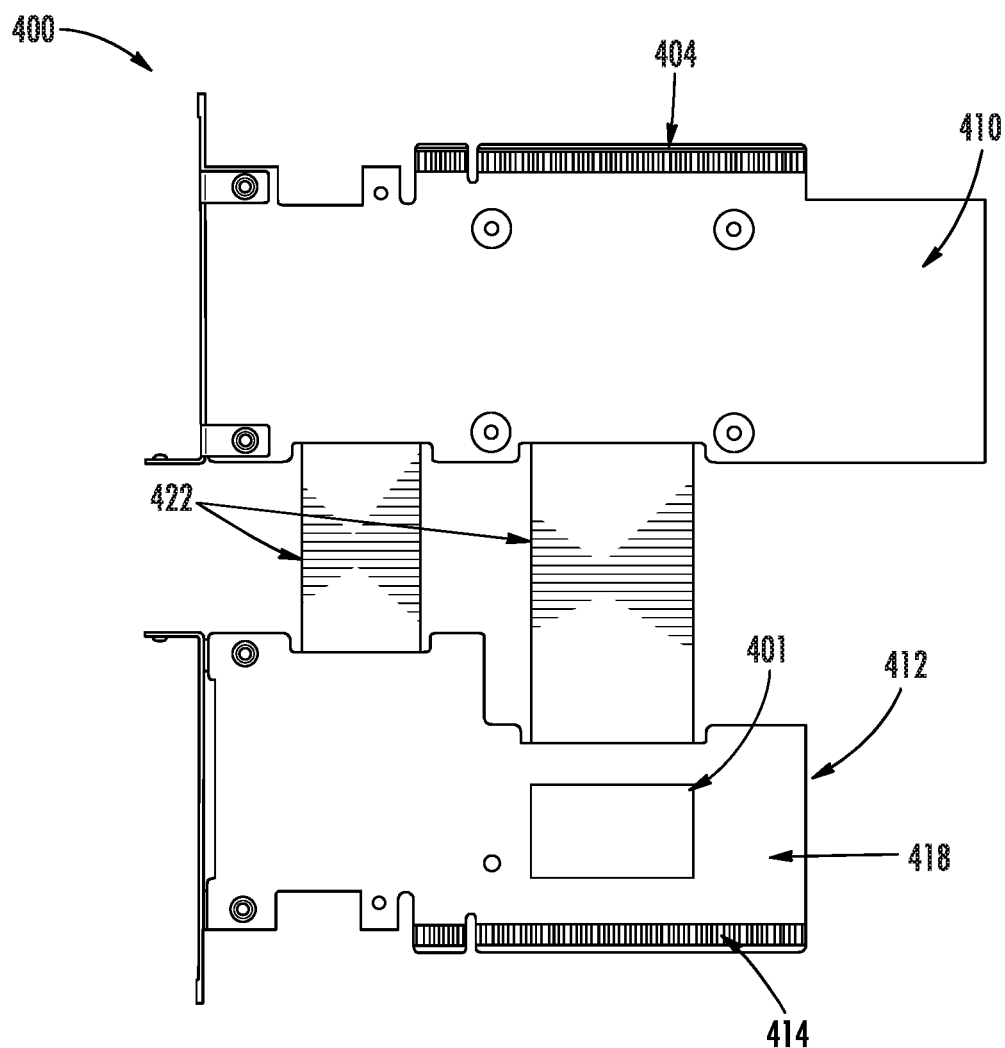

As described above, network cards and associated communication systems may be constrained by regulations (e.g., industry standards or the like) that limit the power supplied to a relevant connection. For example, the power supplied to the primary network card via a card-to-board connection may be restricted to 75 W. As such, traditional systems may restrict or throttle operation of components (e.g., networking chipsets or the like) due to the power limitations associated with the card-to-board connection. With reference to FIGS. 8A-8B, an example networking card arrangement 400 (e.g., arrangement 400) for network connections and dynamical power management is illustrated to address these issues and others.

Figure 9:
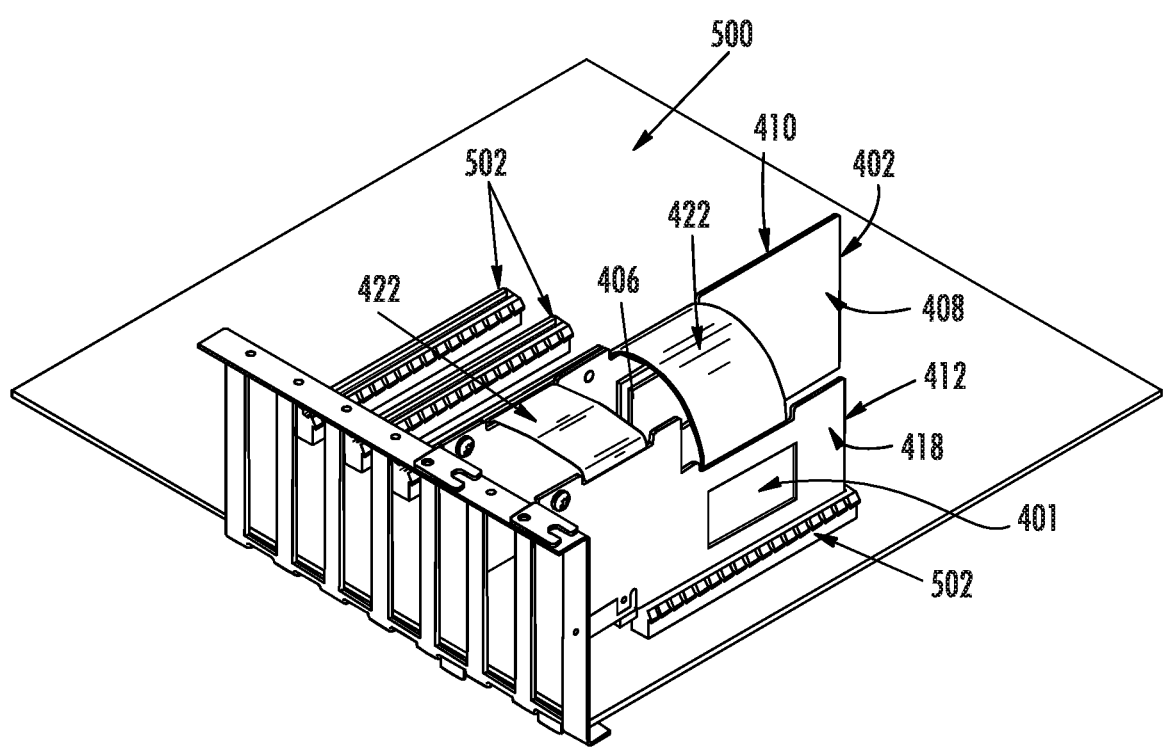
FIG. 9 is a front perspective view of the networking card arrangement of FIG. 8 in an operational configuration according to an example embodiment.
Figure 10:
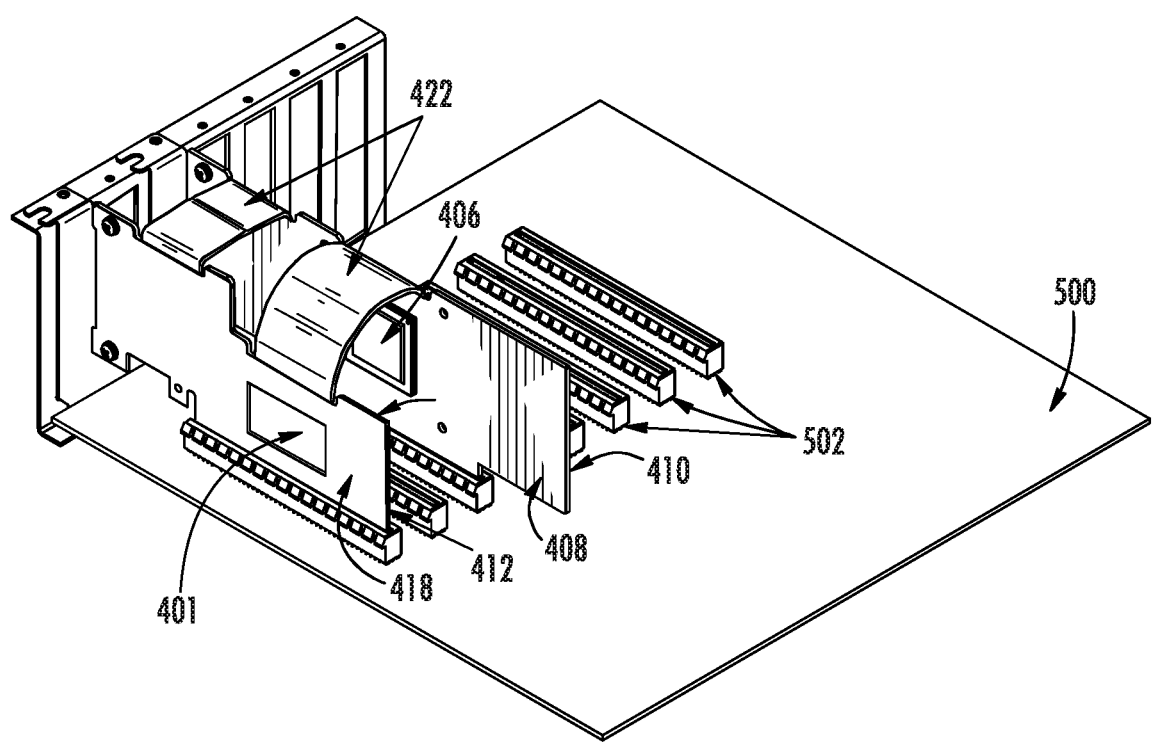
FIG. 10 is a back perspective view of the networking card arrangement of FIG. 8 in an operational configuration according to an example embodiment.

Similar to the arrangement 100, the arrangement 400 may include a primary network card 402, a networking chipset 406 supported by the primary network card 402, and an auxiliary network card 412. The primary network card 402 may define a first card-to-board connection 404 configured to, in an operational configuration such as shown in FIGS. 9-10, communicably couple the primary network card 402 with a substrate (e.g., server board 500, PCB, or the like) via a corresponding element (e.g., card slots 502 or the like) of the substrate. Similarly, the auxiliary network card 412 may define a second card-to-board connection 414 configured to, in an operational configuration, communicably couple the auxiliary network card 412 with a substrate (e.g., server board 500, PCB, or the like) via a corresponding element (e.g., card slots 502 or the like) of the substrate. Although illustrated herein with peripheral component interconnect express (PCIe) components, the present disclosure contemplates that the connections between the primary network card 402, the auxiliary network card 412, and a substrate may be accomplished via any interface for connecting networking components.

As would be evident to one of ordinary skill in the art in light of the present disclosure, the card-to board connections 404, 414 may enable electrical signals to pass between the primary network card 402 and a substrate and the auxiliary network card 412 and the substrate. Furthermore, the card-to-board connections 404, 414 may also operate to supply power (e.g., electrical current) to the primary network card 402 and the auxiliary network card 412, respectively. In some embodiments, the server board 500 may support one or more power sources configured to generate electrical power for supplying to the network cards 402, 412 received by the server board 500 via card slots 502. In other embodiments, the server board 500 may be electrically coupled with an external power source configured to generate and provide electrical power to the network cards 402, 412 received by the server board 500. As described above, however, the electrical power provided to each network card 402, 412 by a respective card-to-board connection may, in some embodiments, be limited by applicable regulation.

With continued reference to FIGS. 8A-8B, the primary network card 402 may define a first surface 408 configured to support the networking chipset 406. The primary network card 402 may further define a second surface 410 located opposite the first surface 408 (e.g., a print surface 410). The first surface 408 of the primary network card 402 may be configured to support a networking chipset 406 thereon. The networking chipset 406 may be configured to control operation of one or more networking components of the arrangement 400. The networking chipset 406 may be embodied in any number of different ways and may, for example, include one or more processing devices configured to perform independently. Furthermore, the networking chipset 406 may be understood to include a single core processor, a multi-core processor, and/or the like. By way of example, the networking chipset 406 may be configured to execute instructions stored in a memory or otherwise accessible to one or more processors of the networking chipset 406. Alternatively or additionally, the networking chipset 406 may be configured to execute hard-coded functionality. As such, whether configured by hardware or by a combination of hardware with software, the networking chipset 406 may represent an entity (e.g., physically embodied in circuitry) capable of performing operations according to an embodiment of the present invention while configured accordingly. Although the first surface 408 of the primary network card 402 is illustrated and described herein with reference to a single networking chipset 406, the present disclosure contemplates that the primary network card 402 may support and/or define other networking elements (e.g., electrical traces, memory, circuitry, and/or the like) based upon the intended application of the arrangement 400. The networking chipset 406 may, at least partially, be powered by electrical current supplied to the primary network card 402 via the first card-to-board connection 404.

With continued reference to FIGS. 8A-8B, the networking card arrangement 400 (e.g., arrangement 400) may also include an auxiliary network card 412 that may define a first surface 418 configured to support power management circuitry 401 as described hereafter. Similar to the primary network card 402, the auxiliary network card 412 may also define a second surface 420 located opposite the first surface 418 (e.g., a print surface 420). The second surface 420 of the auxiliary network card 412 may, due to applicable regulations, define a print surface or side in which no networking components are supported.

The networking card arrangement 400 may further define a card connection element 422 configured to operably connect the primary network card 402 and the auxiliary network card 412 such that electrical signals may be transmitted therebetween. By way of example, the networking chipset 406 may transmit an electrical signal from the primary network card 402 via the card connection element 422 to the cable connectors 416 of the auxiliary network card 412, and vice versa. As described above, the electrical signals transmitted between the primary network card 402 and the auxiliary network card 412 via the card connection element 422 may refer to electrical power (e.g., supplied electrical current) configured to power operation of components of the networking card arrangement 400. In some embodiments, the card connection element 422 comprises a flexible printed circuit board (PCB). In other embodiments, the card connection element 422 comprises a wire harness. While illustrated herein with a flexible PCB as the card connection element 422, the present disclosure contemplates that any connection feature for providing high speed electrical communication between the primary network card 402 and the auxiliary network card 412 may be used.

With reference to FIGS. 9-10, the auxiliary network card 412 may support power management circuitry 401. In an operational configuration in which the primary network card 402 and the auxiliary network card 412 are received by a server board 500 via the first card-to-board connection 404 and the second card-to-board connection 414, the power management circuitry 401 may be configured to direct power from the auxiliary network card 412 to the networking chipset 406 of the primary network card 402 via the card connection element 422. As described herein, the power management circuitry 401 may include any number of power supplies, electrical traces or connections, and/or controller elements configured to direct electrical power (e.g., electrical current and voltage) from the auxiliary network card 412 to the primary network card 402 to increase the power available to the components of the primary network card 402. Although described herein with reference to electrical power directed to the networking chipset 406 of the primary network card 402, the present disclosure contemplates that power from the auxiliary network card 412 may be directed to any component of the primary network card 402.

In some embodiments, the power management circuitry 401 may include a power source (e.g., battery, connection to external power source, or the like) configured to generate power. By way of example, the power management circuitry 401 may include a battery (not shown) or equivalent power source configured to generate power for directing from the auxiliary network card 412 to the primary network card 402. Power management circuitry 401 may include a current limiter that limits the maximum current that is drawn from card slot 502 to the maximum current allowed by the relevant specification. Power management circuitry 401 may also include a voltage regulator unit that allow voltage adjustment (e.g. reducing voltage) to match the necessary voltage per the target circuitry. By way of a particular example, electrical current at any voltage may be generated by the power management circuitry 401 (e.g., power source) and carried via one or more electrical traces defined by the auxiliary network card 412 to the card connection element 422. The card connection element 422 operably connected between the primary network card 402 and the auxiliary network card 412 may transmit the electrical power generated by the power management circuitry 401 to the networking chipset 406. In this way, the power available to the networking chipset 406 may be increased without altering the power supplied to the primary network card 402 by the server board 500 as limited by applicable regulations.

The power management circuitry 401 may, in some embodiments, include passive circuitry (e.g., electrical connections, traces, etc.) configured to direct power supplied from the auxiliary network card 412. As described above, the auxiliary network card 412 may receive electrical power, in the operational configuration, from the server board 500 via the second card-to-board connection 414. The power management circuitry 401 may include electrical connections configured to direct at least a portion of the power received by the second card-to-board connection 414 to the primary network card 402 via the card connection element 422. The card connection element 422 operably connected between the primary network card 402 and the auxiliary network card 412 may transmit the electrical power received by the auxiliary network card 412 at the second card-to-board connection 414 to the networking chipset 406. As above, the power available to the networking chipset 406 may be increased without altering the power supplied to the primary network card 402 by the server board 500 as limited by applicable regulations.

In some instances, the auxiliary network card 412 may not support additional components such that the entirety of the power received at the second card-to-board connection 414 is directed from the auxiliary network card 412 to the networking chipset 406 of the primary network card 402. In other embodiments, however, additional components as described hereafter may be supported by the auxiliary network card 412 such that the power management circuitry 401 directs at least a portion of the power received at the second card-to-board connection 414 to the networking chipset 406. Although described herein with reference to power management circuitry 401 (e.g., passive circuitry) of the auxiliary card 412, the present disclosure contemplates that the primary network card 402 may additionally or alternatively include power management circuitry configured to direct at least a portion of the power received by the primary network card 402 at the first card-to-board connection 404 to the auxiliary network card 412. Said differently, the transmission of electrical power may flow from the primary network card 402 to the auxiliary network card 412 in order to power components supported by the auxiliary network card 412.

In some embodiments, the arrangement 400 may include cable connectors (e.g., cable connectors 116 in FIG. 1B) configured to, in an operational configuration, receive a networking cable (not shown) therein. As described above, the power supplied to the primary card 402 via the first card-to-board connection 404 may be limited by a standard specification. In conventional systems in which cable connectors are located on a single network card, the power supplied to the network card by the associated card-to-board connector may be insufficient to power each of the components supported by the network card and the networking cables (e.g., active optical modules or the like) received by the network card via the cable connectors. As such, the power provided to these traditional systems may operate to restrict, throttle, or otherwise limit the operation of the components of the network card and/or the networking cables. In order to address these issues and others, the arrangement 400 of the present disclosure may support networking cable connectors on an auxiliary network card 412 such that power received by the auxiliary network card 412 via the second card-to-board connector 414 may power the networking cables received by the networking cable connectors.

The cable connectors may define an opening (e.g., opening 117 in FIG. 1A) through which the networking cable may be inserted into the cable connectors, and during operation, the networking cable (not shown) may transmit electrical/optical signals to the arrangement 400 and/or may receive electrical/optical signals from the arrangement 400. In such an embodiment, the power management circuitry 401 may direct a portion of the power received by the auxiliary network card 412 via the second card-to-board connection 414 to one or more of the cable connectors for powering, in whole or in part, the networking cables (not shown) inserted therein. In such an embodiment, the networking cables (not shown) received by the cable connectors may similarly transmit power (e.g., generated by components of the networking cable or the like) to the auxiliary network card 412. The power management circuitry 401 may, for example, direct at least a portion of the power supplied to the auxiliary network card 412 from one or more networking cables received by the one or more networking cable connectors to the networking chipset 406 of the primary network card 402.

In some embodiments, the power management circuitry 401 may include active circuitry (e.g., transistors, amplifiers, voltage regulators, a controller, a computing device, etc.) configured to selectively direct power to the networking chipset 406 of the primary network card 402. In such an embodiment, the power management circuitry 401 may be embodied in any number of different ways and may, for example, include one or more processing devices configured to perform independently. Furthermore, the power management circuitry 401 (e.g., controller) may be understood to include a single core processor, a multi-core processor, and/or the like. By way of example, the power management circuitry 401 (e.g. controller) may be configured to execute instructions stored in a memory or otherwise accessible to one or more processors of the power management circuitry 401 (e.g. controller). Alternatively or additionally, the power management circuitry 401 (e.g. controller) may be configured to execute hard-coded functionality. As such, whether configured by hardware or by a combination of hardware with software, the power management circuitry 401 (e.g. controller) may represent an entity (e.g., physically embodied in circuitry) capable of performing operations according to an embodiment of the present invention while configured accordingly.

In an instance in which the power management circuitry 401 includes a controller or equivalent computing device, the power management circuitry 401 may be configured to receive instructions from the networking chipset 406 indicating a need to increase or decrease the power directed to the networking chipset 406 from the auxiliary network card 412. By way of example, the networking chipset 406 may transmit instructions or a request to increase the power directed to the primary network card 402. In response, the power management circuitry 401 (e.g. controller) may increase the amount of power received by the auxiliary network card 412 (e.g., from a power source, from the second card-to-board connection 414, from a networking cable, etc.) that is directed to the networking chipset 406. Similarly, the networking chipset 406 may transmit instructions or a request to decrease the power directed to the primary network card 402. In response, the power management circuitry 401 (e.g. controller) may decrease the amount of power received by the auxiliary network card 412 (e.g., from a power source, from the second card-to-board connection 414, from a networking cable, etc.) that is directed to the networking chipset 406.

Although described herein with reference to instructions or requests generated by the networking chipset 406 and directed to the power management circuitry 401, the present disclosure contemplates that instructions may also be user inputted or transmitted by another computing device or controller communicably coupled with the networking cable arrangement 400. For example, the present disclosure contemplates that the primary network card 402 may additionally or alternatively include power management circuitry (e.g., active circuitry) configured to receive instructions (e.g., from the networking chipset 406, other components of the primary network card 402, and/or other components of the auxiliary network card 412) indicating a need to increase or decrease the power directed to the auxiliary network card 412 from the primary network card 402. Said differently, the transmission of electrical power may flow from the primary network card 402 to the auxiliary network card 412 in order to power components supported by the auxiliary network card 412.

In other embodiments, the power management circuitry 401 (e.g. controller) may operate to selectively direct power to the networking chipset 406 based upon determinations by the power management circuitry 401. By way of example, in some embodiments, the power management circuitry 401 (e.g. controller) may be coupled to various sensors or other components of the networking card arrangement 400 in order to monitor various parameters of these components. By way of example, the power management circuitry 401 (e.g. controller) may be communicably coupled with the networking chipset 406 via the card connection element 422 and configured to monitor or determine a power output and/or input of the networking chipset 406. By way of additional example, the power management circuitry 401 (e.g. controller) may similarly be communicably coupled to one or more networking cables received by the networking card arrangement 400 and configured to monitor or determine a power requirement associated with these networking cables. In response to any parameter received or determined by the power management circuitry 401 (e.g. controller), the power management circuitry 401 (e.g. controller) may selectively direct power to the networking chipset 406 or other component in order to address related power requirements. In this way, the networking card arrangement 400 may dynamically redistribute power amongst regulation limited network cards.

Similar to the alternative networking card arrangement 300 described above with reference to FIGS. 5-6, the networking card arrangement 400 may also include a secondary network card (not shown) that defines a third card-to-board connection (not shown). As above, the third card-to-board connection (not shown) may enable electrical signals to pass between the secondary network card (not shown) and the server board 500. The additional secondary card may also support power management circuitry (not shown) configured to direct power received by the secondary card (e.g., via a power supply, the third card-to-board connection, networking cables, etc.) to the networking chipset 406 of the primary network card 402. The power management circuitry of the secondary card may operate similar to that described with reference to FIGS. 8A-10.

The invention claimed is:

1. A networking card arrangement comprising:
    a primary network card, wherein the primary network card defines a first card-to-board connection;
    a networking chipset supported by the primary network card;
    an auxiliary network card, wherein the auxiliary network card defines a second card-to-board connection;
    power management circuitry; and
    a card connection element configured to operably connect the primary network card and the auxiliary network card such that electrical signals may be transmitted therebetween,
    wherein, in an operational configuration in which the primary network card and the auxiliary network card are received by a server board via the first card-to-board connection and the second card-to-board connection, the power management circuitry is configured to direct power between the auxiliary network card and the primary network card via the card connection element.

2. The networking card arrangement according to claim 1, wherein the primary network card further defines a first surface supporting the networking chipset and a second surface opposite the first surface.

3. The networking card arrangement according to claim 2, wherein the auxiliary network card further defines a first surface supporting the power management circuitry and a second surface opposite the first surface such that the power management circuitry is configured to direct power from the auxiliary network card to the primary network card via the card connection element.

4. The networking card arrangement according to claim 3, wherein, in the operational configuration, the primary network card and the auxiliary network card are positioned such that the first surface of the primary network card is proximate the second surface of the auxiliary network card.

5. The networking card arrangement according to claim 1, wherein the primary network card further defines a first surface supporting the networking chipset and the power management circuitry and a second surface opposite the first surface such that the power management circuitry is configured to direct power from the primary network card to the auxiliary network card via the card connection element.

6. The networking card arrangement according to claim 1, wherein the card connection element comprises a flexible printed circuit board (PCB) or wire harness.

7. The networking card arrangement according to claim 1, wherein the power management circuitry further comprises a power source configured to generate power for directing to the networking chipset of the primary network card.

8. The networking card arrangement according to claim 1, wherein the power management circuitry is further configured to, in the operational configuration, direct power supplied to the auxiliary network card by the second card-to-board connection to the primary network card.

9. The networking card arrangement according to claim 1, further comprising one or more networking cable connectors supported on the auxiliary network card, wherein each networking cable connector is configured to receive a networking cable therein, and wherein the power management circuitry is further configured to direct power supplied to the auxiliary network card from one or more networking cables received by the one or more networking cable connectors to the networking chipset of the primary network card.

10. The networking card arrangement according to claim 1, wherein the power management circuitry further comprises a controller configured to selectively direct power between the auxiliary network card and the primary network card.

11. A method of manufacturing a networking card arrangement, the method comprising:
    providing a primary network card, wherein the primary network card defines a first card-to-board connection;
    supporting a networking chipset on the primary network card;
    providing an auxiliary network card, wherein the auxiliary network card defines a second card-to-board connection;
    providing power management circuitry; and
    providing a card connection element configured to operably connect the primary network card and the auxiliary network card such that electrical signals may be transmitted therebetween,
    wherein, in an operational configuration in which the primary network card and the auxiliary network card are received by a server board via the first card-to-board connection and the second card-to-board connection, the power management circuitry is configured to direct power between the auxiliary network card and the primary network card via the card connection element.

12. The method according to claim 11, wherein the primary network card further defines a first surface supporting the networking chipset and a second surface opposite the first surface.

13. The method according to claim 12, wherein the auxiliary network card further defines a first surface supporting the power management circuitry and a second surface opposite the first surface such that the power management circuitry is configured to direct power from the auxiliary network card to the primary network card via the card connection element.

14. The method according to claim 13, wherein, in the operational configuration, the primary network card and the auxiliary network card are positioned such that the first surface of the primary network card is proximate the second surface of the auxiliary network card.

15. The method according to claim 11, wherein the primary network card further defines a first surface supporting the networking chipset and the power management circuitry and a second surface opposite the first surface such that the power management circuitry is configured to direct power from the primary network card to the auxiliary network card via the card connection element.

16. The method according to claim 11, wherein the card connection element comprises a flexible printed circuit board (PCB) or wire harness.

17. The method according to claim 11, wherein the power management circuitry further comprises a power source configured to generate power for directing to the networking chipset of the primary network card.

18. The method according to claim 11, wherein the power management circuitry is further configured to, in the operational configuration, direct power supplied to the auxiliary network card by the second card-to-board connection to the primary network card.

19. The method according to claim 11, further comprising supporting one or more networking cable connectors on the auxiliary network card, wherein each networking cable connector is configured to receive a networking cable therein, and wherein the power management circuitry is further configured to direct power supplied to the auxiliary network card from one or more networking cables received by the one or more networking cable connectors to the networking chipset of the primary network card.

20. The method according to claim 11, wherein the power management circuitry further comprises a controller configured to selectively direct power between the auxiliary network card and the primary network card.

* * * * *